United States Patent
Kamatani

(10) Patent No.: US 7,940,036 B2
(45) Date of Patent: May 10, 2011

(54) VOLTAGE COMPARISON CIRCUIT, AND SEMICONDUCTOR INTEGRATED CIRCUIT AND ELECTRONIC DEVICE HAVING THE SAME

(75) Inventor: Tomohiko Kamatani, Hyogo (JP)

(73) Assignee: Ricoh Company, Ltd., Tokyo (JP)

(*) Notice: Subject to any disclaimer, the term of this patent is extended or adjusted under 35 U.S.C. 154(b) by 261 days.

(21) Appl. No.: 12/367,749

(22) Filed: Feb. 9, 2009

(65) Prior Publication Data

US 2009/0206806 A1 Aug. 20, 2009

(30) Foreign Application Priority Data

Feb. 14, 2008 (JP) ................................ 2008-032706

(51) Int. Cl.
G05F 3/04 (2006.01)

(52) U.S. Cl. .................... 323/312; 323/316; 327/538

(58) Field of Classification Search .......... 323/312–317; 330/252, 253, 277, 297; 327/538–543
See application file for complete search history.

(56) References Cited

U.S. PATENT DOCUMENTS

| 5,404,097 | A  | * | 4/1995  | Barou ............................ 323/312 |
| 5,986,481 | A  | * | 11/1999 | Kaminishi ....................... 327/96 |
| 7,573,922 | B2 | * | 8/2009  | Kamatani et al. .......... 372/38.01 |
| 7,592,855 | B2 | * | 9/2009  | Kamatani ....................... 327/525 |
| 2006/0255785 | A1 | * | 11/2006 | Kanzaki ........................ 323/282 |

FOREIGN PATENT DOCUMENTS

| JP | 2004-194124 | 7/2004 |
| JP | 2005-86646  | 3/2005 |
| JP | 3926645     | 3/2007 |

* cited by examiner

*Primary Examiner* — Jessica Han
(74) *Attorney, Agent, or Firm* — Cooper & Dunham LLP

(57) ABSTRACT

A disclosed voltage comparison circuit for detecting a voltage difference of two input signals includes one or more differential amplifier circuits, each of which has a differential pair of first and second input transistors each having an electrode to which a corresponding one of the input signals is input, a constant current circuit configured to generate constant current according to a control signal and supply the constant current to the first and second input transistors, and a first resistor connected between the constant current circuit and the first input transistor; and a current control circuit configured to control a value of the first constant current. The current control circuit controls the value so that a voltage difference between both ends of the first resistor becomes equal to a predetermined value.

15 Claims, 10 Drawing Sheets

VOLTAGE COMPARISON CIRCUIT, AND SEMICONDUCTOR INTEGRATED CIRCUIT AND ELECTRONIC DEVICE HAVING THE SAME

BACKGROUND OF THE INVENTION

1. Field of the Invention

The present invention is directed to a voltage comparison circuit capable of detecting that two different signals reach a certain offset level and used for suppressing noise in a differential serial signal and detecting connection to transmission lines used for transmitting a differential serial signal. The present invention, in particular, relates to a voltage comparison circuit having an offset, applicable to a squelch circuit and a disconnection detection circuit, for example, used in USB 2.0, and also applicable for Hall signal detection by a hysteresis comparator used in a motor driver.

2. Description of the Related Art

A conventional voltage comparison circuit having an offset uses a method of setting the value of the offset voltage by connecting load resistors to the source terminals of transistors forming a differential pair, as shown in FIG. 11 (for example, see Patent Document 1). In addition, as a means to vary the offset voltage value, MOS switches for changing the resistance value are used or laser trimming is performed, to improve the accuracy of the setting of the offset voltage value. Another conventional method sets the offset voltage value by controlling the current value of one terminal of a constant current source load (e.g. see Patent Document 2).

[Patent Document 1] Japanese Laid-open Patent Application Publication No. 2004-194124

[Patent Document 2] Japanese Patent Publication No. 3926645

However, in the case illustrated in FIG. 11, it is necessary to use a resistor large enough to be able to ignore the on-resistance of the MOS switches or the trimming bit resistor of the laser trimming, and therefore, the amount of current allowed to flow through the differential pair is limited. Accordingly, the conventional technology is unsuitable for high-speed response detection capable of detecting the level difference of two signals in compliance with high-speed serial transmission, for example, USB 2.0 serial data link. Also, resistors and MOS switches relatively large in size are required, leading to an increase in the circuit size. Furthermore, in the case of setting the offset voltage by switching the MOS switches or by laser trimming, the setting needs to be made in a post-manufacturing process, which leads to an increase in cost. The case of setting the offset voltage by controlling the current value of one terminal of a constant current source load is suitable for high-speed serial transmission since it allows high-speed response; however, if matching of respective transistors is not ideal, the accuracy of the setting of the offset voltage value varies to an extent, thereby making it difficult to control the current value. Furthermore, if the detection offset level of a differential signal is large, the current ratio between the transistors of the differential pair becomes extremely large, making it difficult to control the variation.

SUMMARY OF THE INVENTION

In view of the above-mentioned problems, the present invention aims at providing a voltage comparison circuit for detecting a voltage difference of two input signals. The voltage comparison circuit includes one or more differential amplifier circuit units, each of which has a differential pair of a first input transistor and a second input transistor each having a control electrode to which a corresponding one of the input signals is input, a constant current circuit unit configured to generate a first constant current in accordance with an input control signal and supply the first constant current to the first input transistor and the second input transistor, and a first resistor connected between the constant current circuit unit and the first input transistor; and a current control circuit unit configured to perform operational control on the constant current circuit unit to control a current value of the first constant current. The current control circuit unit controls the current value of the first constant current so that a voltage difference between both ends of the first resistor becomes equal to a predetermined value.

DETAILED DESCRIPTION OF THE PREFERED EMBODIMENTS

Figure 1:
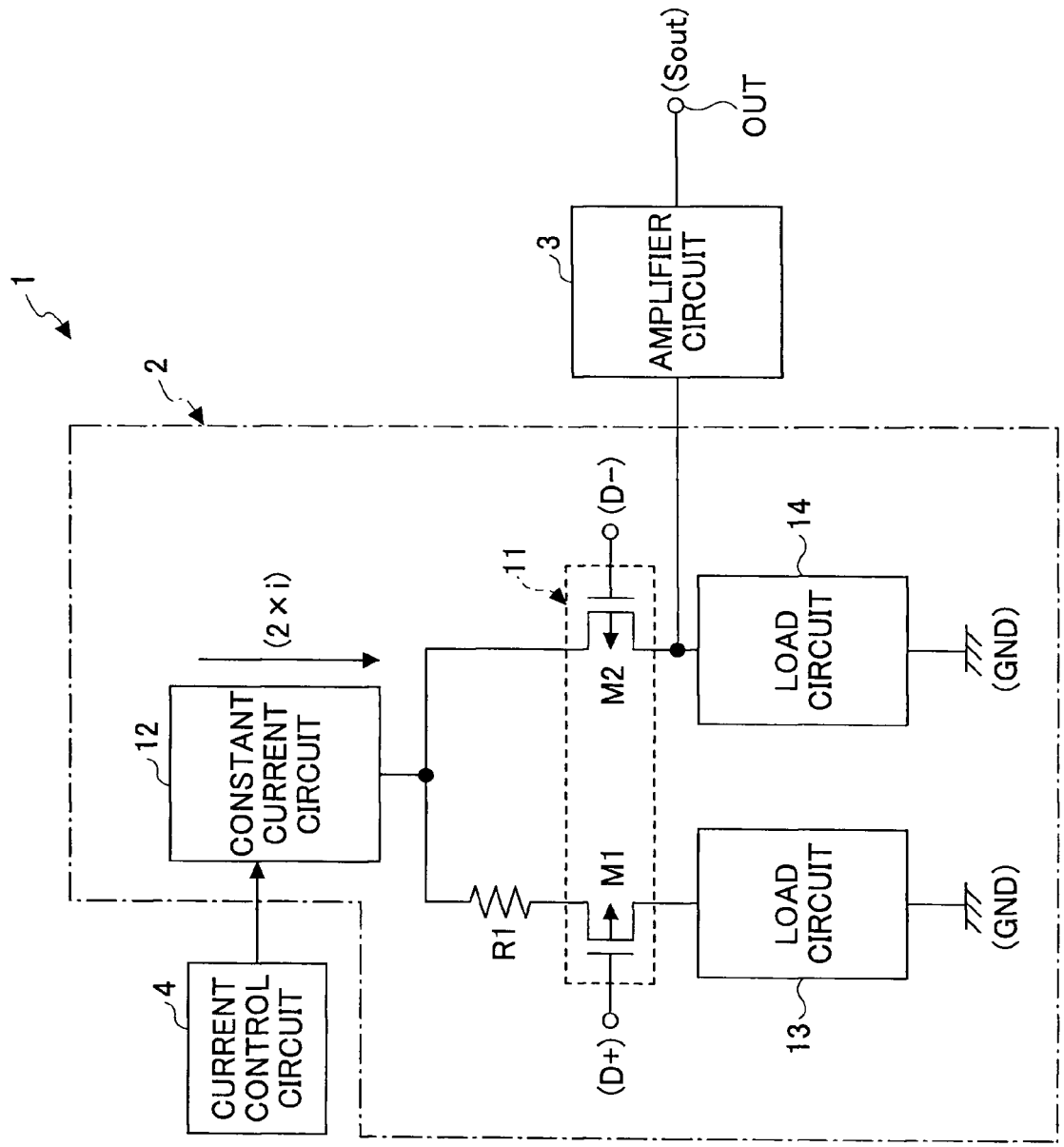
FIG. 1 illustrates an example of a circuit structure of a voltage comparison circuit according to the first embodiment of the present invention.

Next is described the present invention in detail based on an embodiment illustrated in the drawings.

First Embodiment

FIG. 1 illustrates a structural example of a voltage comparison circuit according to the first embodiment of the present invention.

The voltage comparison circuit 1 of FIG. 1, having an offset, generates an output signal Sout which indicates whether a voltage difference between input signals D+ and D−, each of which is input to a corresponding input terminal, is equal to or greater than a predetermined value Va and outputs the output signal Sout from an output terminal OUT.

The voltage comparison circuit 1 includes a differential amplifier circuit 2 having input terminals to which the input signal D+ and the input signal D− are respectively input; an amplifier circuit 3 for amplifying a signal output from the differential amplifier circuit 2 and outputting the amplified signal; and a current control circuit 4 for controlling bias currents, which flow through the differential amplifier circuit 2 and the amplifier circuit 3, respectively.

The differential amplifier circuit 2 includes a differential input circuit 11 having input transistors M1 and M2, which are a differential pair of PMOS transistors; a constant current circuit 12 for generating a constant current in accordance with a control signal input from the current control circuit 4 and inputting the generated constant current into the differential input circuit 11 as a bias current; load circuits 13 and 14, which function as load elements of the differential input circuit 11; and a resistor R1 having a resistance value R, connected between the input transistor M1 and the constant current circuit 12 and configured to provide an offset voltage.

The resistor R1 is connected between the current output terminal of the constant current circuit 12 and the source terminal of the input transistor M1, and the load circuit 13 is connected between the drain terminal of the input transistor M1 and ground potential GND. The input signal D+ is input to the gate terminal of the input transistor M1.

Furthermore, the source terminal of the input transistor M2 is connected to the current output terminal of the constant current circuit 12, and the load circuit 14 is connected between the drain terminal of the input transistor M2 and ground GND. The input signal D− is input to the gate terminal of the input transistor M2. The connection between the input transistor M2 and the load circuit 14 forms an output terminal of the differential amplifier circuit 2, and is connected to the input terminal of the amplifier circuit 3. The output terminal of the amplifier circuit 3 is connected to the output terminal OUT, from which the output signal Sout is output.

The current control circuit 4 performs control such that the signal level of the output signal Sout is inverted when a voltage difference between the input signals D+ and D− exceeds the predetermined value Va. Specifically, the current control circuit 4 performs control on the constant current circuit 12 in terms of the current value of an output current (2×i) in such a manner that a voltage drop (i×R) becomes equal to the predetermined value Va. The voltage drop (i×R) is induced when a current i, which is ½ the current (2×i) supplied from the constant current circuit 12, flows through the resistor R1.

Figure 2:
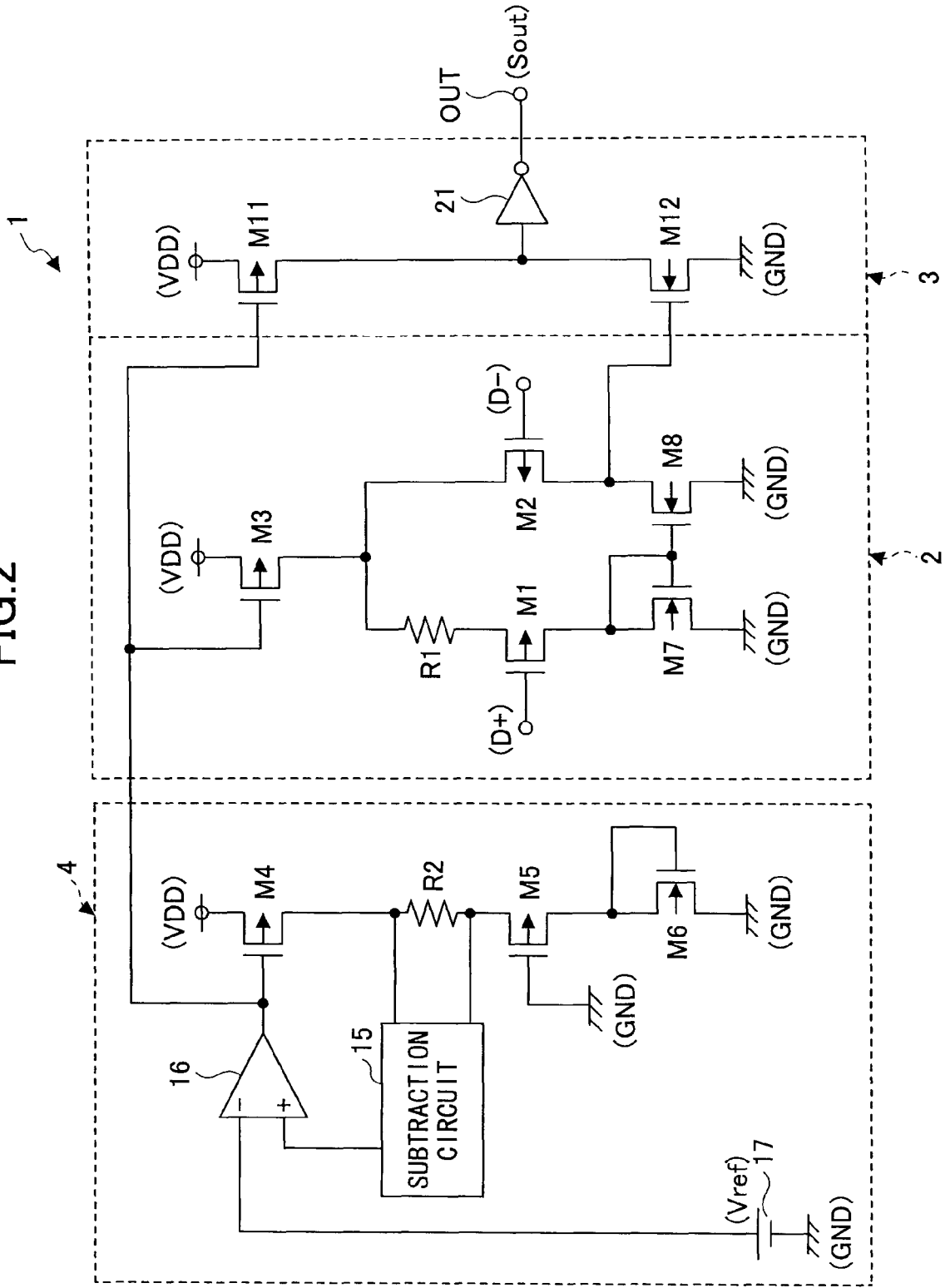
FIG. 2 is a circuit example of the voltage comparison circuit 1 of FIG. 1.

FIG. 2 illustrates a circuit example of the voltage comparison circuit 1 of FIG. 1.

In FIG. 2, the current control circuit 4 includes PMOS transistors M4 and M5, an NMOS transistor M6, a resistor R2 having the resistance value R, a subtraction circuit 15, an operational amplifier circuit 16, and a reference voltage source 17 for generating and outputting a reference voltage Vref having the predetermined value Va. In FIG. 2, a PMOS transistor M3 functions as the constant current circuit 12, an NMOS transistor M7 functions as the load circuit 13, and an NMOS transistor M8 functions as the load circuit 14. The NMOS transistors M7 and M8 form a current mirror circuit. The amplifier circuit 3 includes a PMOS transistor M11, an NMOS transistor M12 and an inverter 21.

Note that the input transistor M1 corresponds to the "first input transistor" as defined in the appended claims. Similarly, the input transistor M2 corresponds to the "second input transistor"; the PMOS transistor M3, the "constant current circuit" and "first transistor"; the resistor R1, the "first resistor"; the differential amplifier circuit 2, the "differential amplifier circuit unit"; the current control circuit 4, the "current control circuit unit"; the PMOS transistor M4, the "proportional current generation circuit unit" and "second transistor"; the resistor R2, the "second resistor"; the operational amplifier circuit 16, the "control circuit"; the load circuit 13, the "first load circuit"; the load circuit 14, the "second load circuit"; the PMOS transistor M5, the "third transistor"; and the NMOS transistor M6, the "third load circuit".

As for the PMOS transistor M3, the source terminal is connected to a power supply voltage VDD, the drain terminal is connected to the connection between the resistor R1 and the source terminal of the input transistor M2, and the gate terminal is connected to the output terminal of the operational amplifier circuit 16. As for the PMOS transistor M4, the source terminal is connected to the power supply voltage VDD, and the gate terminal is connected to the output terminal of the operational amplifier circuit 16. The resistor R2 is connected between the drain terminal of the PMOS transistor M4 and the source terminal of the PMOS transistor M5, and an NMOS transistor M6 is connected between the drain terminal of the PMOS transistor M5 and ground GND. The gate terminal of the PMOS transistor M5 is connected to ground GND. The gate terminal of the NMOS transistor M6 is connected to its drain terminal, thus forming a diode. Each end of the resistor R2 is connected to the subtraction circuit 15. The output terminal of the subtraction circuit 15 is connected to the non-inverting input terminal of the operational amplifier circuit 16. The reference voltage Vref is input to the inverting input terminal of the operational amplifier circuit 16.

As for the NMOS transistors M7 and M8, their source terminals are connected to the ground voltages GND. Their gate terminals are connected to each other, and the connection is connected to the drain terminal of the NMOS transistor M7. The drain terminal of the NMOS transistor M7 is connected the drain terminal of the input transistor M1, and the drain terminal of the NMOS transistor M8 is connected to the drain terminal of the input transistor M2.

In the amplifier circuit 3, the PMOS transistor M11 and the NMOS transistor M12 are connected in series between the power supply voltage VDD and ground GND. The gate terminal of the PMOS transistor M11 is connected to the output terminal of the operational amplifier circuit 16, and the gate terminal of the NMOS transistor M12 is connected to the connection between the drain terminal of the input transistor M2 and the drain terminal of the NMOS transistor M8. The connection between the PMOS transistor M11 and the NMOS transistor M12 is connected to the input terminal of the inverter 21. The output terminal of the inverter 21 is connected to the output terminal OUT.

In the above-described structure, the size of the PMOS transistor M4 is ½ that of the PMOS transistor M3, and the resistance value of the resistor R2 is the same as that of the resistor R1. The input transistors M1 and M2 and the PMOS transistor M5 have the same transistor size, and the NMOS transistors M6 through M8 have the same transistor size. The subtraction circuit 15 calculates a voltage difference between the ends of the resistor R2, and outputs the calculated difference to the non-inverting input terminal of the operational amplifier circuit 16. Then, the operational amplifier circuit 16 performs operational control on the PMOS transistors M3, M4 and M11 in such a manner that the output voltage of the subtraction circuit 15 becomes equal to the reference voltage Vref.

Accordingly, the current i output from the PMOS transistor M4 becomes equal to Va/R, and the current output from the PMOS transistor M3 becomes equal to 2×i=2×Va/R. That is, when the signal level of the output signal Sout is inverted, the current i flows through each of the input transistors M1 and M2. Since the input transistors M1 and M2 have the same gate-source voltages Vgs, the signal level of the output signal Sout is inverted when the voltage difference between the input signal D+ input to the gate terminal of the input transistor M1 and the input signal D− input to the gate terminal of the input transistor M2 becomes equal to the voltage value Va.

When the signal level of the output signal Sout is inverted, the current values of the currents flowing through the input transistors M1 and M2 are substantially the same, and even if the voltage value Va is high, the ratio of these currents remains constant. Therefore, if the input transistors M1 and M2 are formed with high accuracy so that the transistor size ratio between the input transistors M1 and M2 becomes constant, it is possible to very simply achieve the voltage comparison circuit 1 capable of accurately setting the offset value.

In addition, in order to set the offset value of the voltage comparison circuit 1 accurately to the voltage value Va, it is necessary to set the ratio of the resistance values of the resistors R1 and R2 with high accuracy. The ratio of the resistance values can be relatively easily set with high accuracy by forming the resistors R1 and R2 on a single silicon substrate. It is, therefore, possible to simply achieve the voltage comparison circuit 1 capable of accurately setting the offset value.

In the case where the resistors R1 and R2 are manufactured in a single integrated circuit (IC), the ratio of their resistance values can be maintained with high accuracy; however, variation in the absolute values of the resistors R1 and R2 occurs due to process fluctuation and temperature fluctuation. According to the structure of the voltage comparison circuit 1 of the first embodiment, however, even if variation in the absolute values of the resistors R1 and R2 occurs due to process fluctuation and temperature fluctuation, the current of the constant current source changes in accordance with the variation. For example, if the finished resistors R1 and R2 have a resistance value 30% less than a desired resistance value, the current value of the constant current i contrarily becomes 30% larger than originally expected. Accordingly, the offset amount is corrected so that the offset voltage is maintained at the voltage value Va, and the voltage comparison circuit 1 is able to always detect whether the voltage difference between the input signals D+ and D− exceeds the voltage value Va. Herewith, the voltage comparison circuit 1 is preferably produced in a single IC.

Figure 3:
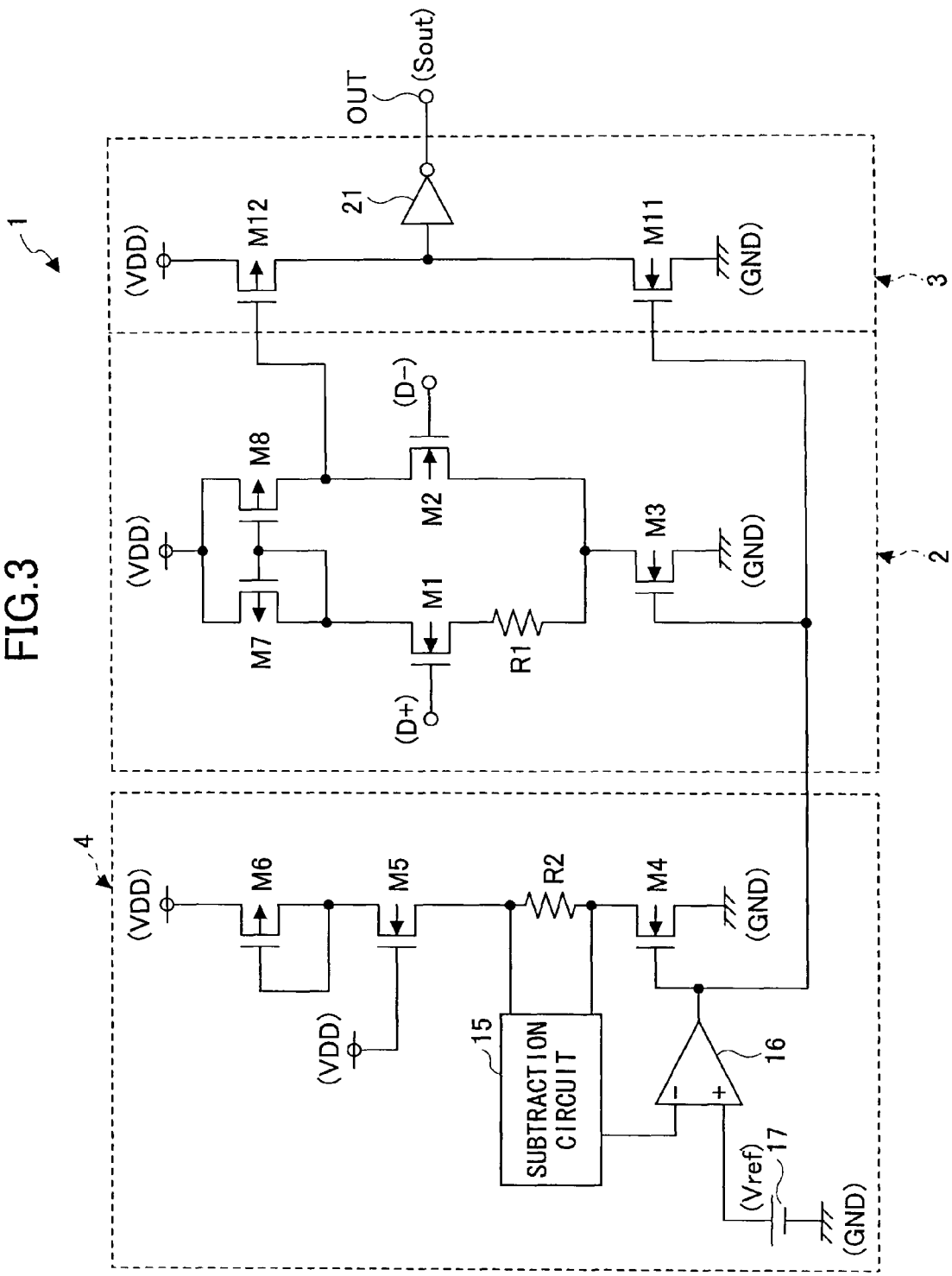
FIG. 3 is another circuit example of the voltage comparison circuit according to the first embodiment of the present invention.

FIG. 2 illustrates an example in which PMOS transistors are used for the input transistors M1 and M2; however, NMOS transistors may be used instead. In this case, the circuit structure of FIG. 2 is changed to that of FIG. 3.

For the sake of simple explanation, in FIG. 2, the influence of the channel length modulation effect λ of the input transistors M1 and M2 is ignored; however, the source-drain current ids of a MOS transistor is expressed by the following equation (1).

$$ids = \beta/2 \times W/L \times (Vgs-Vth)^2 \times (1+\lambda \times Vds) \quad (1)$$

Figure 4:
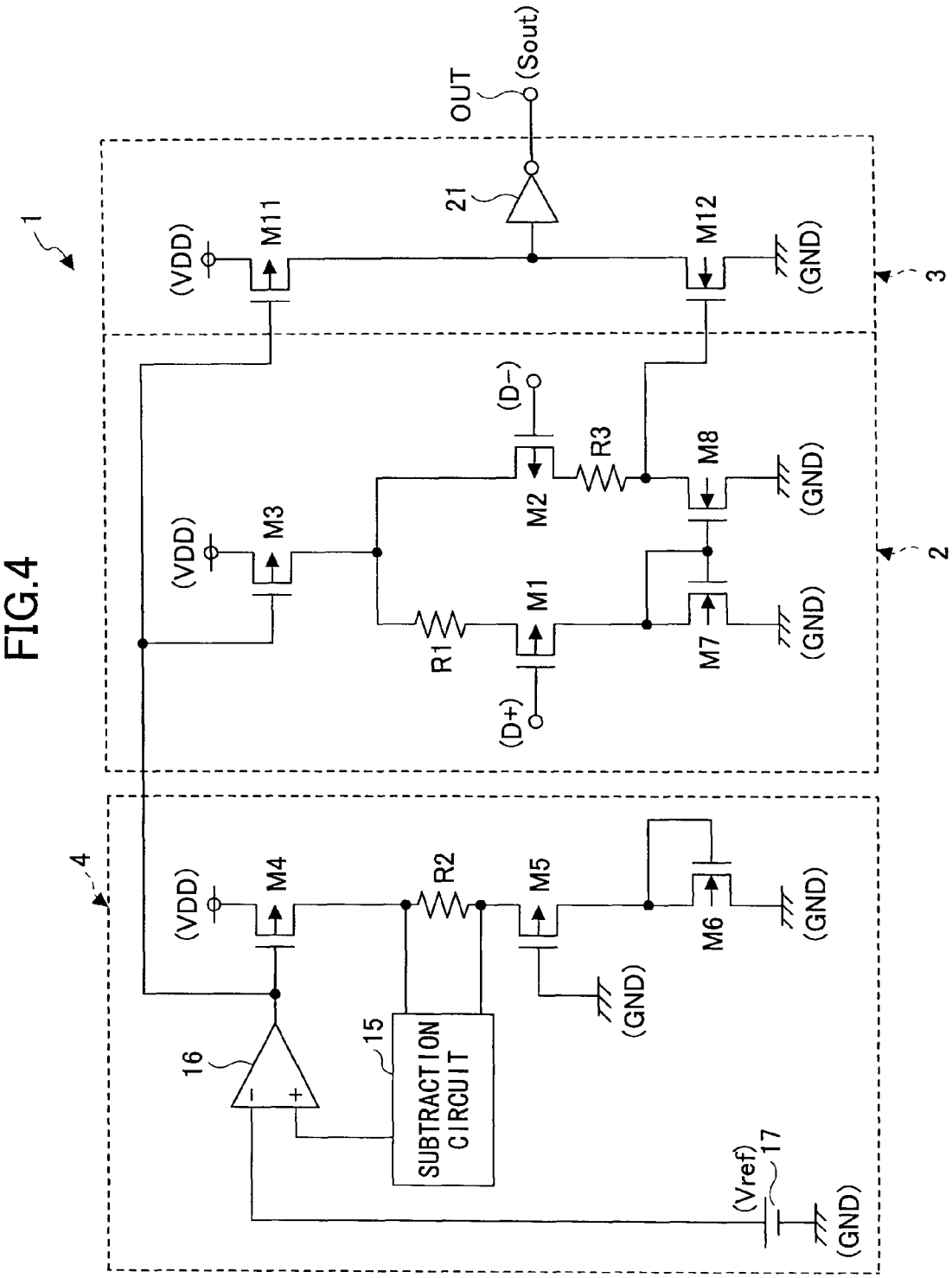
FIG. 4 is another circuit example of the voltage comparison circuit according to the first embodiment of the present invention.

If the voltage difference between the drain-source voltages Vds of the input transistors M1 and M2, i.e. the voltage value Va, is small, the influence of the channel length modulation effect λ is almost negligible; however, if the voltage value Va is large, a large error occurs. In this case, such an error can be substantially eliminated by inserting a resistor R3 having the same resistance value R as those of the resistors R1 and R2 between the input transistor M2 and the NMOS transistor M8, as shown in FIG. 4. Note that the resistor R3 corresponds to the "fourth resistor" as defined in the appended claims.

However, in this case, since the response speed of the voltage comparison circuit 1 slightly decreases, it is necessary to set the resistance value R as small as possible while setting the current value of the current i as large as possible, thereby setting the detection speed of the voltage comparison circuit 1 to a desired speed.

In FIG. 2, the transistor size of the PMOS transistor M4 may be 1/(2×α) the transistor size of the PMOS transistor M3; the transistor size of the PMOS transistor M5, 1/α the transistor size of the input transistors M1 and M2; the transistor size of the NMOS transistor M6, 1/α the transistor size of the NMOS transistors M7 and M8; the resistance value of the resistor R1, γ×R; and the resistance value of the resistor R2, α×R. In this case, the voltage difference detected by the voltage comparison circuit 1 is determined to be a product of the ratio of the reference voltage Vref to the resistance value of the resistor R1 and the ratio of the reference voltage Vref to the resistance value of the resistor R2. Herewith, it is possible to allow the constant current circuit 12, which does not need to have an operating speed as high as that of the differential input circuit 11, to have low power consumption.

Figure 5:
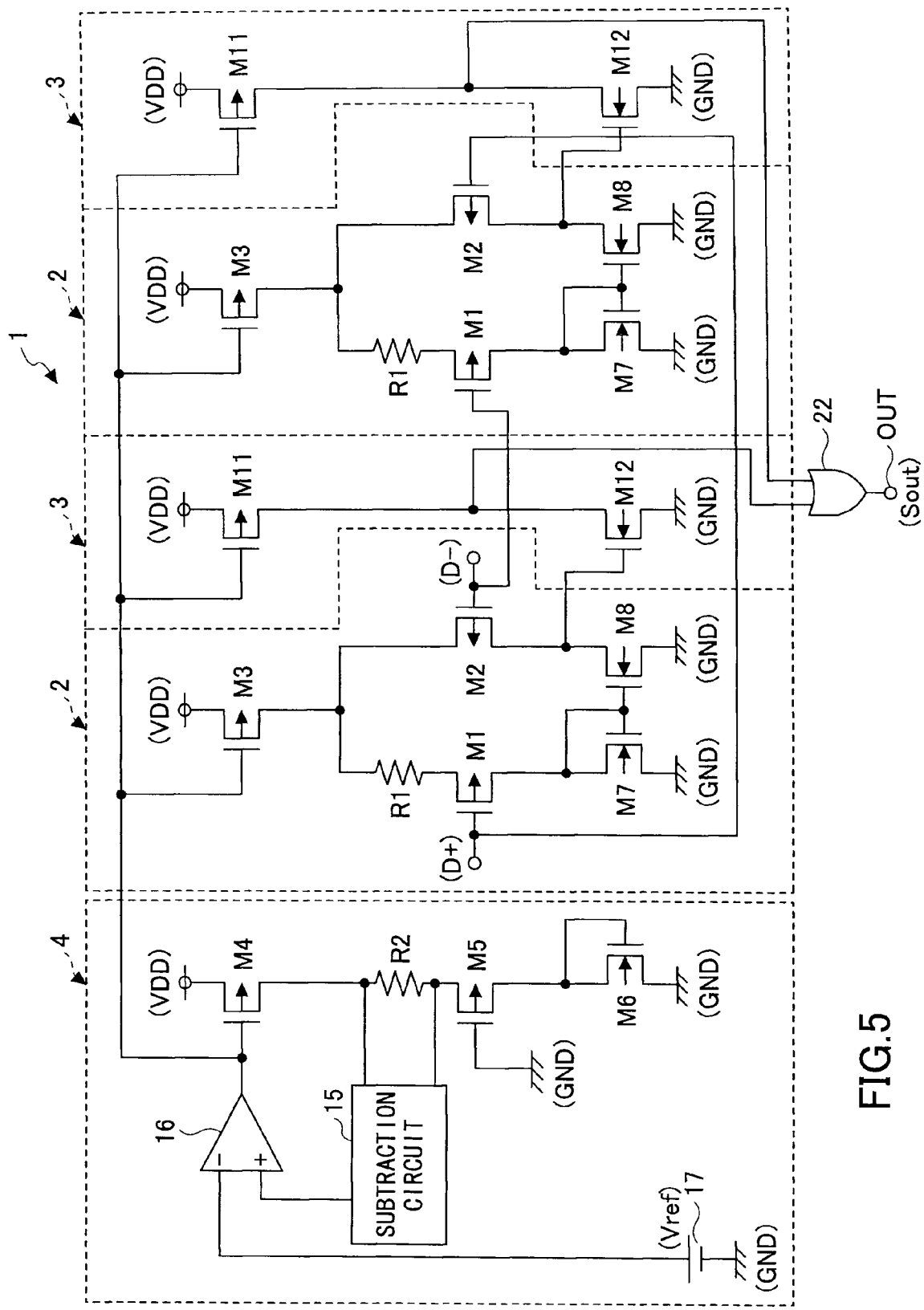
FIG. 5 is another circuit example of the voltage comparison circuit according to the first embodiment of the present invention.

The circuit structure of FIG. 2 is able to detect only (D+voltage)−(D−voltage)>Va. Given this factor, another differential amplifier circuit 2 and amplifier circuit 3 may be added to the circuit of FIG. 2, as shown in FIG. 5 (the transistor sizes and the resistance value are the same as those of FIG. 2). In the added differential amplifier circuit 2, the input signals D− and D+ are input to the gate terminals of the input transistors M2 and M1, respectively. An OR circuit 22 performs the logical OR operation on output signals of the two amplifier circuits 3 to detect whether |(D+voltage)−(D−voltage)|>Va. In addition, if the resistance value of each resistor R1 of FIG. 5 is set to α×R, it is possible to detect whether |(D+voltage)−(D−voltage)|>α×Va.

Hence, to detect whether |(D+voltage)−(D−voltage)|>Va as well as whether |(D+voltage)−(D−voltage)|>α×Va, it only takes two voltage comparison circuits 1 of FIG. 5, i.e. the voltage comparison circuit 1 having the resistor R1 whose resistance value is R and the voltage comparison circuit 1 having the resistor R1 whose resistance value is α×R. In this case, the single current control circuit 4 can be shared by the two voltage comparison circuits 1, thereby reducing the cost of production.

For example, the circuit for detecting whether |(D+voltage)−(D−voltage)|>Va may be used as a squelch detection circuit for detecting that a serial data signal is equal to or lower than the squelch level; and the circuit for detecting whether |(D+voltage)−(D−voltage)|>α×Va may be used as a disconnection detection circuit for detecting disconnection of a serial data transmission line. Although such a squelch detection circuit and a disconnection detection circuit used in USB 2.0 Host/Function are required to ensure high detection accuracy and high-speed response, these detection circuits can be readily provided by using the voltage comparison circuits 1 shown in FIG. 5. Furthermore, in the case of using both the squelch detection circuit and the disconnection detection circuit, only one current control circuit 4 is necessary, thereby reducing the cost of production.

Figure 6:
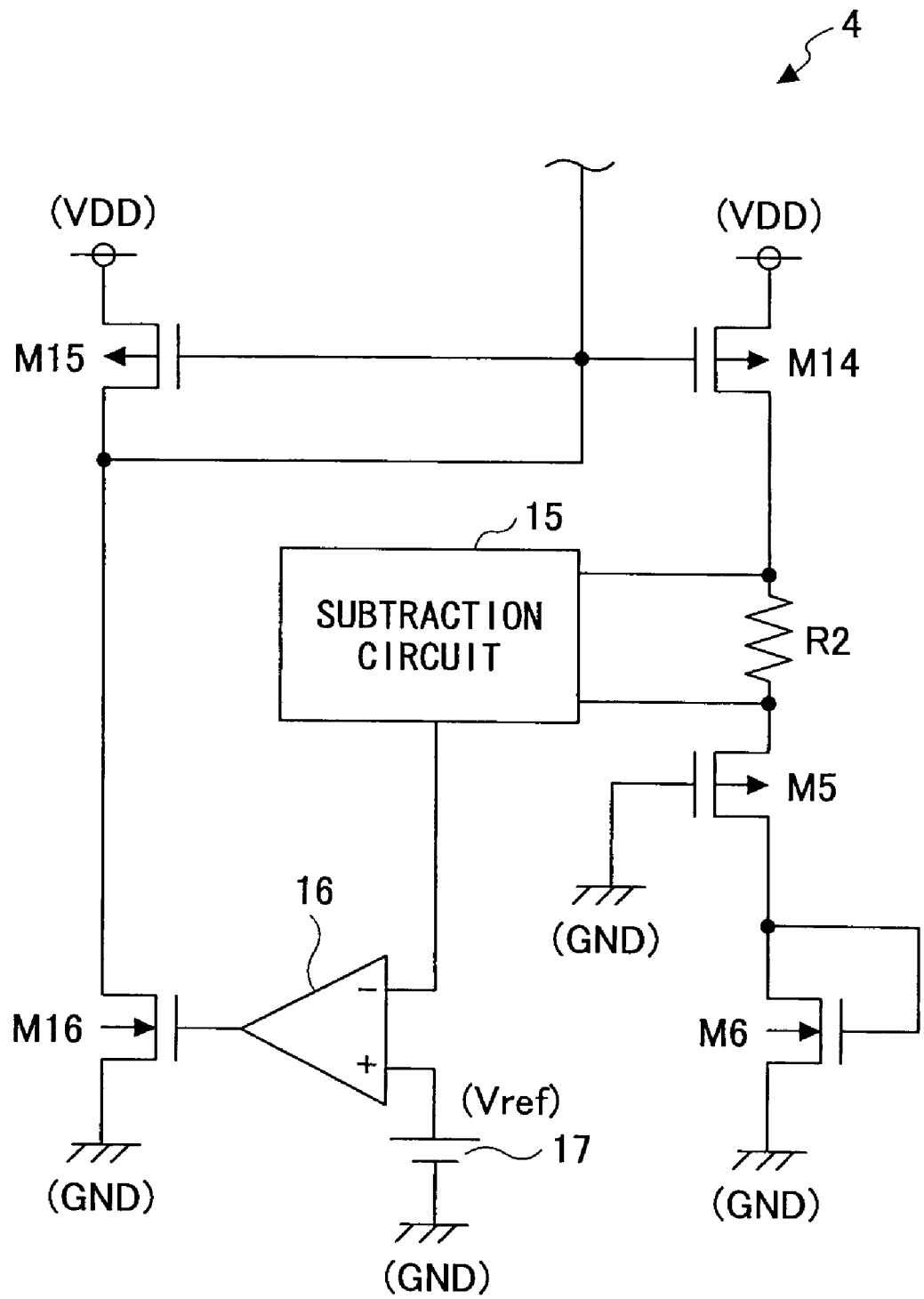
FIG. 6 is another circuit example of a current control circuit 4.

FIG. 6 is another circuit example of the current control circuit 4. In FIG. 6, the same reference numerals are given to the components which are common to those of FIG. 2.

In FIG. 6, the current control circuit 4 includes PMOS transistors M4, M5 and M15, NMOS transistors M6 and M16, the resistor R2 having the resistance value R, the subtraction circuit 15, the operational amplifier circuit 16 and the reference voltage source 17.

The PMOS transistors M4 and M15 form a current mirror circuit. As for the PMOS transistors M4 and M15, each source terminal is connected to the power supply voltage VDD, and their gate terminals are connected to each other. The connection of the gate terminals is connected to the drain terminal of the PMOS transistor M15 and also connected to the gate terminals of the PMOS transistors M3 and M11.

The resistor R2 is connected between the drain terminal of the PMOS transistor M4 and the source terminal of the PMOS transistor M5, and the NMOS transistor M6 is connected between the drain terminal of the PMOS transistor M5 and ground GND. The gate terminal of the PMOS transistor M5 is connected to ground GND. The gate terminal of the NMOS transistor M6 is connected to its drain terminal, thus forming a diode. Each end of the resistor R2 is connected to the subtraction circuit 15. The output terminal of the subtraction circuit 15 is connected to the inverting input terminal of the operational amplifier circuit 16. The reference voltage Vref is input to the non-inverting input terminal of the operational amplifier circuit 16.

The NMOS transistor M16 is connected between the drain terminal of the PMOS transistor M15 and ground GND. The gate terminal of the NMOS transistor M16 is connected to the output terminal of the operational amplifier circuit 16. The PMOS transistors M15, M4, M3 and M11 form a current mirror circuit. The operational amplifier circuit 16 controls the currents output from the PMOS transistor M4, M3 and M11 by performing operational control on the PMOS transistor M16 in such a manner that the output voltage of the subtraction circuit 15 becomes equal to the reference voltage Vref.

Figure 7:
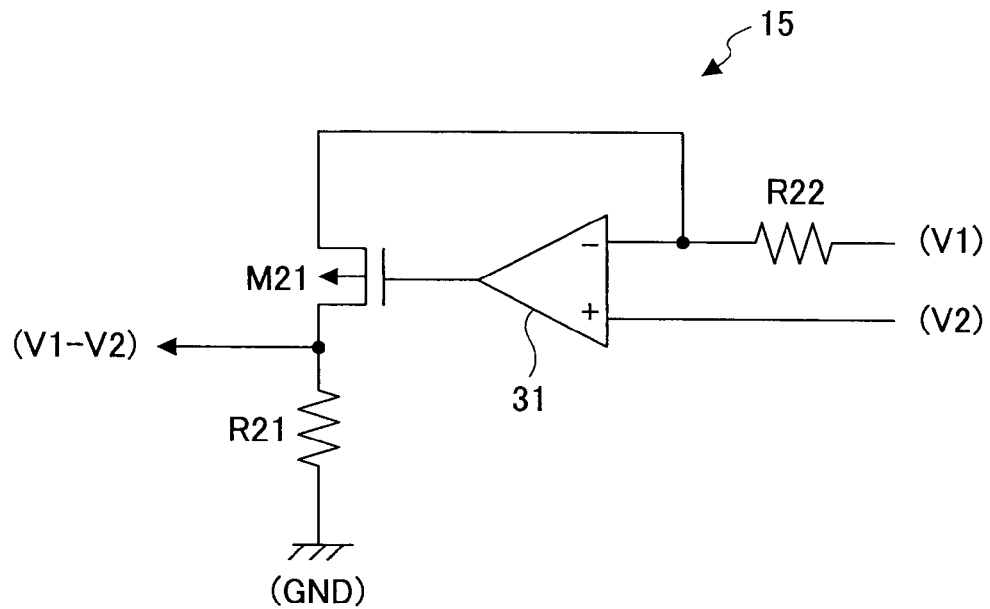
FIG. 7 illustrates a circuit example of a subtraction circuit 15.

FIG. 7 illustrates a circuit example of the subtraction circuit 15.

In FIG. 7, the subtraction circuit 15 is designed to generate a voltage (V1−V2) obtained by subtracting an input voltage V2 from an input voltage V1 and output the generated voltage, and includes a PMOS transistor M21, an operational amplifier circuit 31, and resistors R21 and R22.

The input voltage V1 is input to the inverting input terminal of the operational amplifier circuit 31 via the resistor R22, and the input voltage V2 is input to the non-inverting input terminal of the operational amplifier circuit 31. Between the inverting input terminal of the operational amplifier circuit 31 and ground GND, the PMOS transistor M21 and the resistor R21 are connected in series, and the gate terminal of the PMOS transistor M21 is connected to the output terminal of the operational amplifier circuit 31. The output voltage (V1−V2) is output from the connection of the PMOS transistor M21 and the resistor R21.

Figure 8:
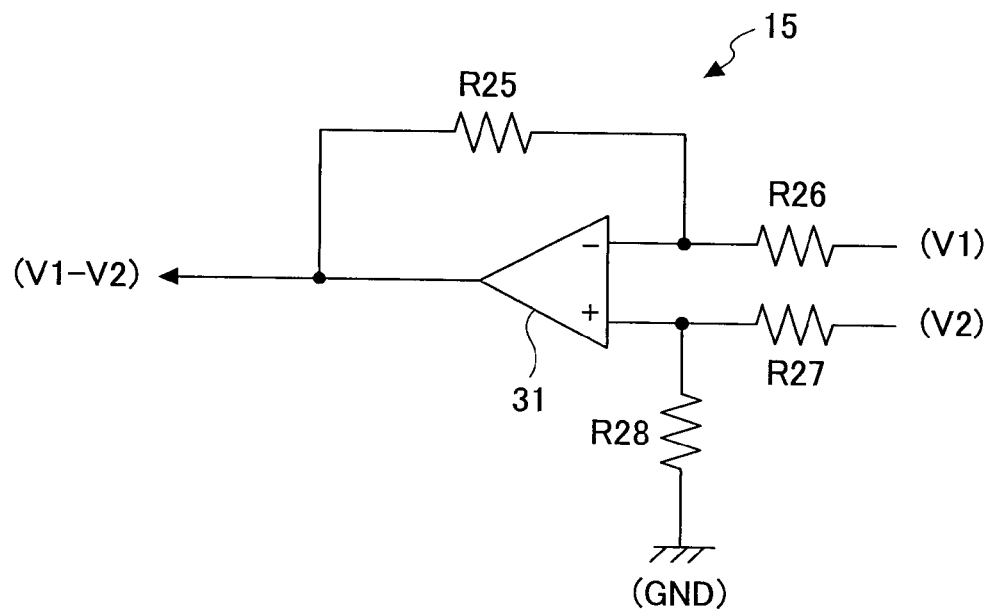
FIG. 8 illustrates another circuit example of the subtraction circuit 15.

FIG. 8 illustrates another circuit example of the subtraction circuit 15. In FIG. 8, the same reference numerals are given to the components which are common to those of FIG. 7.

In FIG. 8, the subtraction circuit 15 is designed to generate the voltage (V1−V2) obtained by subtracting the input voltage V2 from the input voltage V1 and output the generated voltage, and includes the operational amplifier circuit 31 and resistors R25 through R28.

The input voltage V1 is input to the inverting input terminal of the operational amplifier circuit 31 via the resistor R26, and the resistors R27 and R28 are connected in series between the input voltage V2 and ground GND. The connection between the resistors R27 and R28 is connected to the non-inverting input terminal of the operational amplifier circuit 31, and the resistor R25 is connected between the inverting input terminal and output terminal of the operational amplifier circuit 31. The output voltage (V1−V2) is output from the output terminal of the operational amplifier circuit 31.

Figure 9:
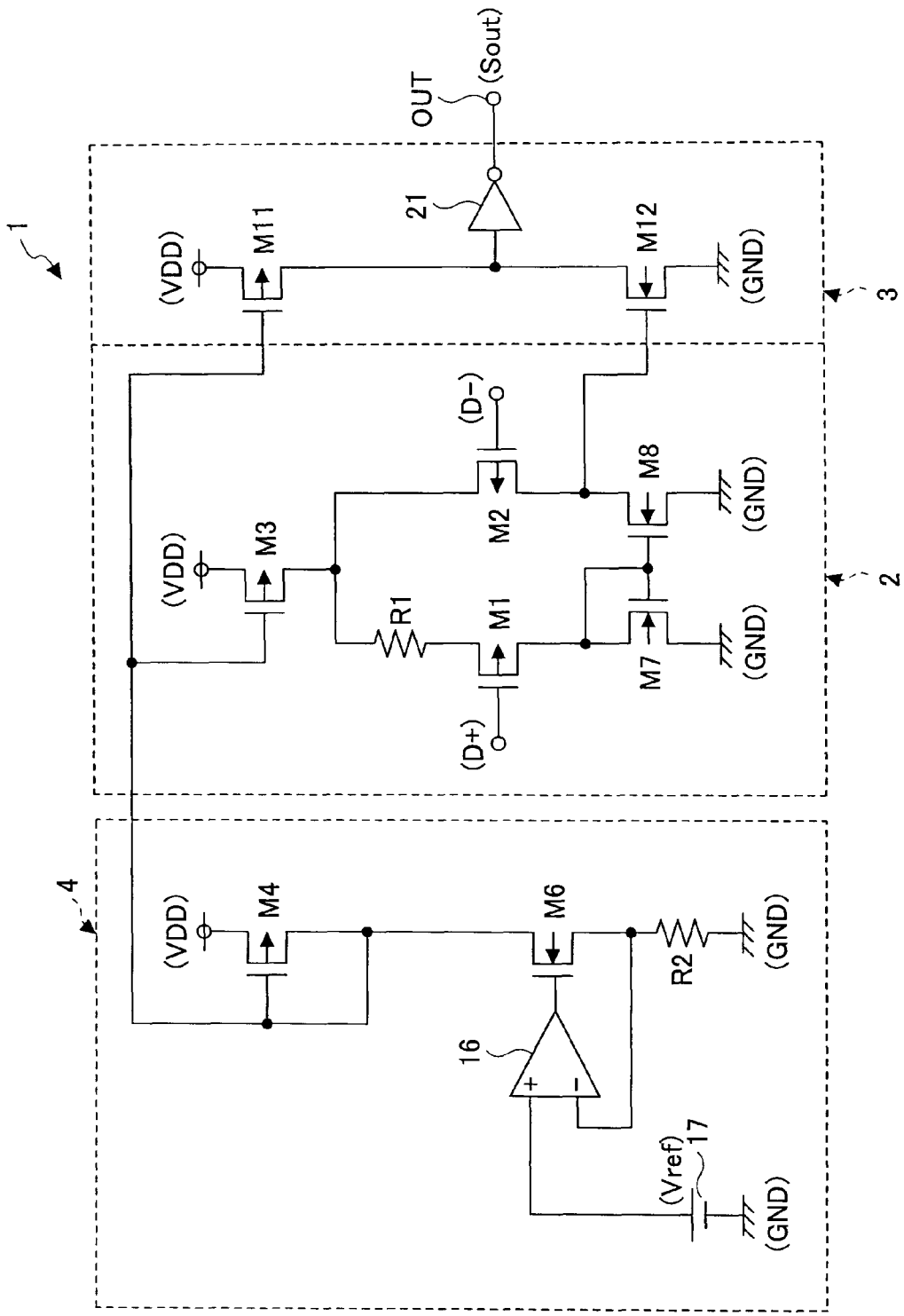
FIG. 9 illustrates another circuit example of the voltage comparison circuit according to the first embodiment of the present invention.

Next, FIG. 9 illustrates another circuit example of the current control circuit 4. In FIG. 9, the same reference numerals are given to the components which are common to those of FIG. 2, and their descriptions are omitted while only a difference from FIG. 2 is explained.

The difference of FIG. 9 from FIG. 2 is the circuit structure of the current control circuit 4.

In the current control circuit 4 of FIG. 9, the PMOS transistor M4 forms a current mirror circuit together with the PMOS transistors M3 and M11. The source terminal of the PMOS transistor M4 is connected to the power supply voltage VDD, and the gate terminal of the PMOS transistor M4 is connected to its drain and also connected to the gate terminals of the PMOS transistors M3 and M11.

The drain terminal of the PMOS transistor M4 is connected to the drain terminal of the NMOS transistor M6, and the resistor R2 is connected between the source terminal of the NMOS transistor M6 and ground GND. In the operational amplifier circuit 16, the inverting input terminal is connected to the connection between the NMOS transistor M6 and the resistor R2, the reference voltage Vref is input to the non-inverting input terminal, and the output terminal is connected to the gate terminal of the NMOS transistor M6. Note that, in FIG. 9, the NMOS transistor M6 and the operational amplifier circuit 16 form a control circuit.

The operational amplifier circuit 16 performs operational control on the NMOS transistor M6 in such a manner that the voltage at the connection between the NMOS transistor M6 and the resistor R2 becomes equal to the reference voltage Vref. The same current flowing through the NMOS transistor M6 also flows through the PMOS transistor M4, and currents proportional to the current flowing through the PMOS transistor M4 respectively flow through the PMOS transistors M3 and M11. When the resistance value of the resistor R1 is R, the resistance value of the resistor R2 is (α×R)/γ and the voltage value of the reference voltage Vref is Va. Accordingly, a constant current (Va×γ)/(α×R) flows through the PMOS transistor M4. The transistor size of the PMOS transistor M3 is 2×α times that of the PMOS transistor M4, and when the current value of the current flowing through the resistor R1 is Va×γ/R, i.e. a voltage between both ends of the resistor R1 is γ×Va, the signal level of the output signal Sout is inverted. It should be noted that the current control circuit of FIG. 9 may be used as the current control circuit 4 of FIGS. 3 through 5.

Figure 10:
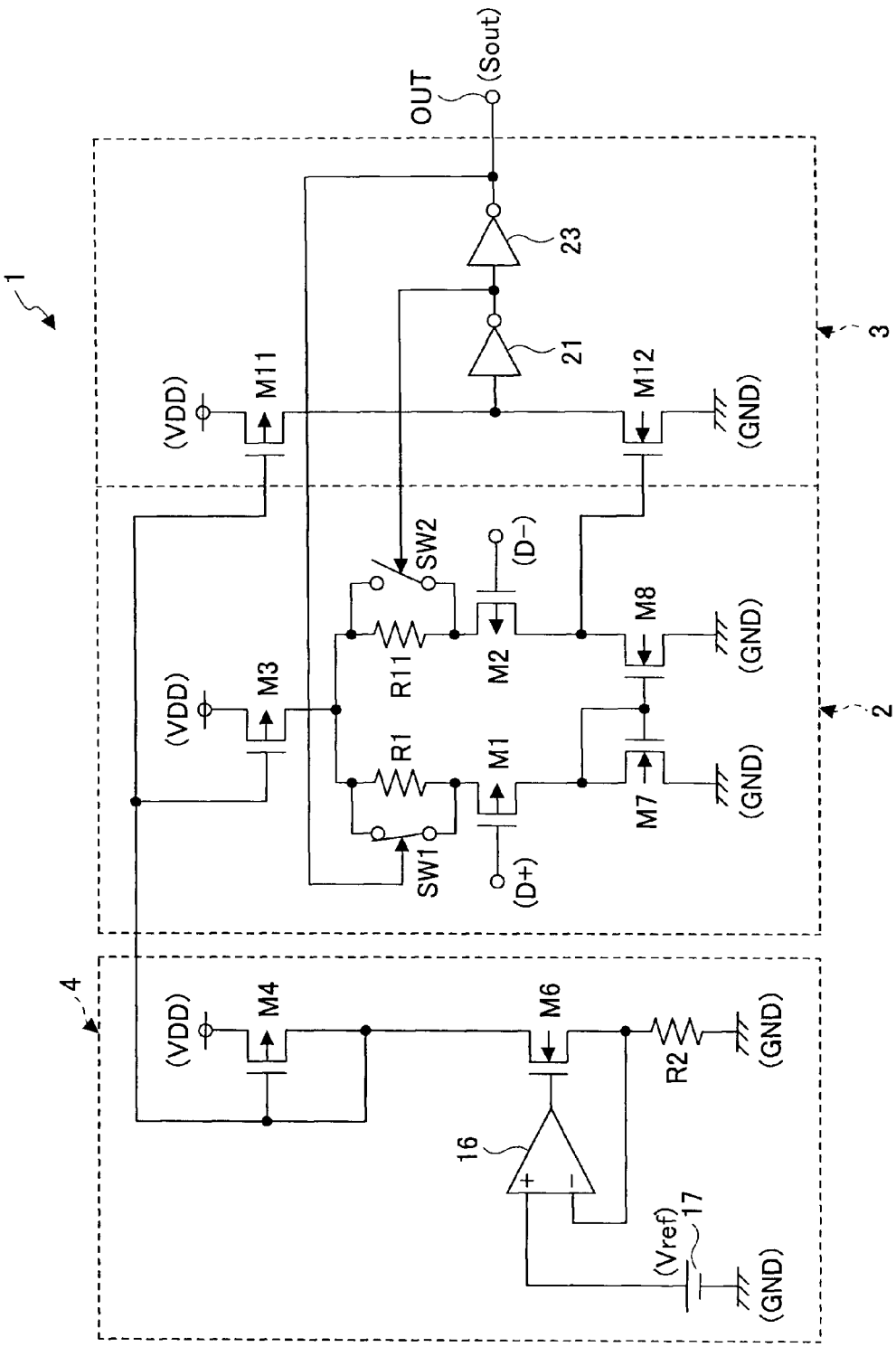
FIG. 10 illustrate another circuit example of the voltage comparison circuit according to the first embodiment of the present invention.
Figure 11:
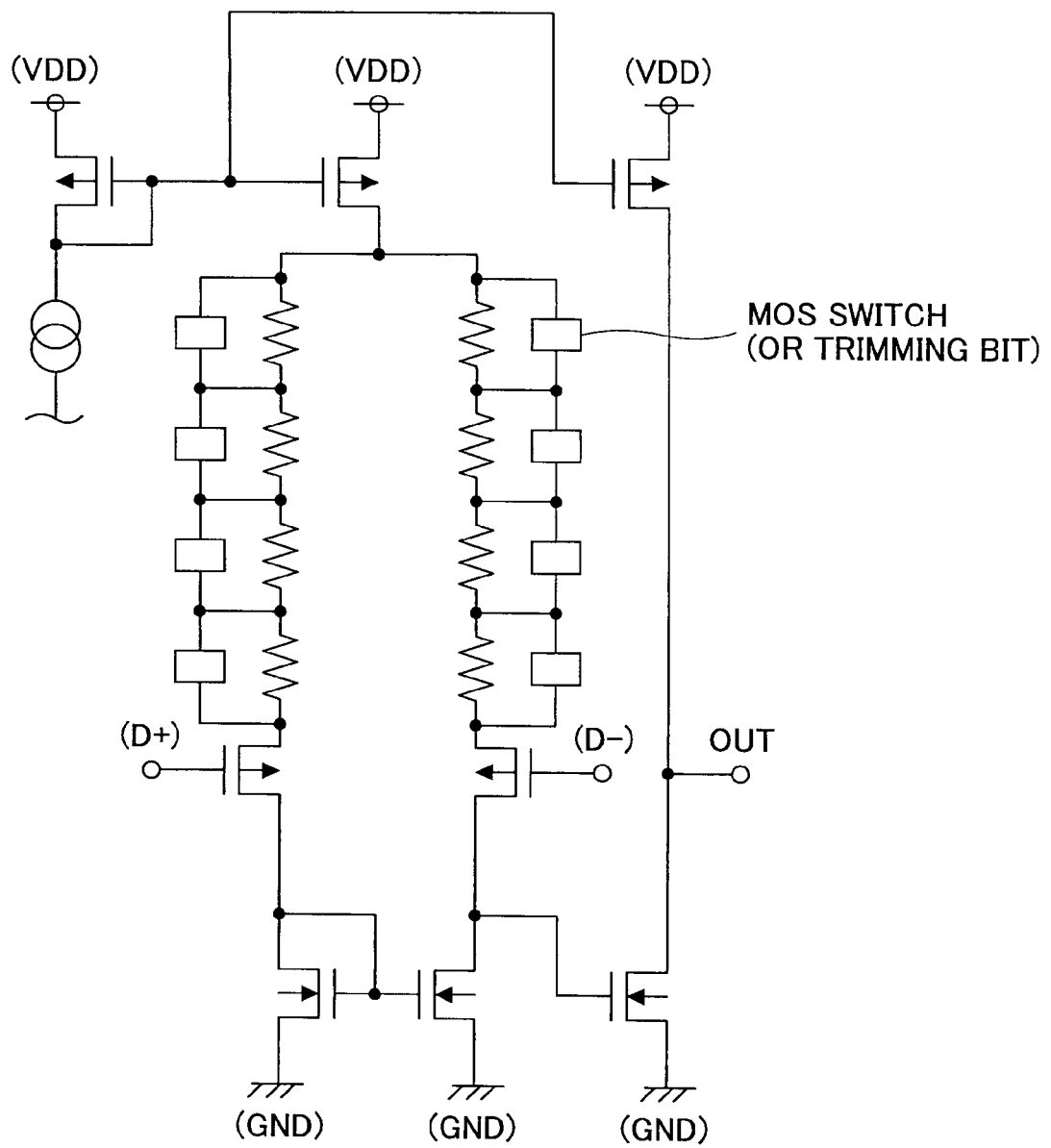
FIG. 11 illustrates a circuit diagram showing a conventional example of a voltage comparison circuit having an offset.

In the case where hysteresis is provided in the voltage comparison circuit 1 of FIG. 9, the circuit structure of FIG. 9 is changed to that of FIG. 10. FIG. 10 differs from FIG. 9 in that a resistor R11 and switches SW1 and SW2 are added to the differential amplifier circuit 2 of FIG. 9 and an inverter 23 is added to the amplifier circuit 3 of FIG. 9. Note that the resistor R11 corresponds to the "third resistor" as defined in the appended claims. Similarly, the switches SW1 and SW2 correspond to the "first switch unit" and "second switch unit", respectively.

The resistor R11 is connected between the drain terminal of the PMOS transistor M3 and the source terminal of the PMOS transistor M2, and the switches SW1 and SW2 are connected parallel to the resistors R1 and R11, respectively.

The output terminal of the inverter 21 is connected to the input terminal of the inverter 23, and the output terminal of the inverter 23 is connected to the output terminal OUT. The switch SW1 performs a switching operation in accordance with the signal level of the output signal Sout, and the switch SW2 performs a switching operation in accordance with the signal level of the output signal of the inverter 21. Herewith, hysteresis can be provided in the voltage comparison circuit 1. Note that FIG. 10 is based on the case of FIG. 9; however, hysteresis can be provided in the cases of FIGS. 2 through 5.

Since the application of the hysteresis to the cases of FIGS. 2 through 5 is the same as shown in FIG. 10, the explanation is omitted.

As has been described above, the voltage comparison circuit of the first embodiment includes the resistor R1 connected in series between the constant current circuit 12 and one (M1) of the two input transistors of the differential input circuit 11, and is designed so that the current control circuit 4 controls the current output from the PMOS transistor M3, which functions as the constant current circuit 12 for supplying the bias currents to the input transistors M1 and M2, in such a manner that the voltage difference between both ends of the resistor R1 becomes constant at the predetermined value Va. Herewith, the variation in the threshold voltage can be reduced, and it is possible to detect the occurrence of a predetermined offset voltage between the two input signals at high speed and with high accuracy.

Note that the voltage comparison circuit of the first embodiment may be incorporated into a semiconductor integrated circuit, and such a semiconductor integrated circuit may be used in various electronic devices having predetermined functions.

This application is based on Japanese Patent Application No. 2008-032706 filed on Feb. 14, 2008, the contents of which are hereby incorporated herein by reference.

What is claimed is:

1. A voltage comparison circuit for detecting a voltage difference of two input signals, the voltage comparison circuit comprising:
   one or more differential amplifier circuit units, each of which includes a differential pair of a first input transistor and a second input transistor each input transistor having a control electrode to which a corresponding one of the input signals is input, a constant current circuit unit configured to generate a first constant current in accordance with an input control signal and supply the first constant current to the first input transistor and the second input transistor, and a first resistor connected between the constant current circuit unit and the first input transistor; and
   a current control circuit unit configured to perform operational control on the constant current circuit unit to control a current value of the first constant current;
   wherein the current control circuit unit controls the current value of the first constant current so that a voltage difference between both ends of the first resistor becomes equal to a predetermined value.

2. The voltage comparison circuit as claimed in claim 1, wherein the current control circuit unit includes a proportional current generating circuit configured to generate and output a proportional current proportional to the first constant current output from the constant current circuit unit; a second resistor through which the proportional current output from the proportional current generating circuit flows; a subtraction circuit configured to calculate and output a voltage difference between both ends of the second resistor; and a control circuit configured to perform operational control on the constant current circuit unit and the proportional current generating circuit in such a manner that the voltage difference output from the subtraction circuit becomes equal to a predetermined reference voltage.

3. The voltage comparison circuit as claimed in claim 2, further comprising a load circuit unit functioning as a load of the differential pair and including a first load circuit connected in series to the first input transistor and a second load circuit connected in series to the second input transistor, wherein the current control circuit unit includes a third transistor connected in series to the second resistor and having a control electrode to which a signal is input so that the third transistor is always ON to be conductive, and a third load circuit configured to function as a load of the third transistor.

4. The voltage comparison circuit as claimed in claim 3, wherein the first input transistor, the second input transistor and the third transistor are MOS transistors of a same type, having a same transistor size.

5. The voltage comparison circuit as claimed in claim 3, wherein the first load circuit, the second load circuit and the third load circuit are MOS transistors of a same type, having a same transistor size.

6. The voltage comparison circuit as claimed in claim 2, wherein the second resistor has a resistance value equal to a resistance value of the first resistor.

7. The voltage comparison circuit as claimed in claim 2, wherein the constant current circuit unit is formed of a first transistor for outputting current in accordance with the input control signal which is input from the current control circuit unit to a control electrode of the first transistor, the proportional current generating circuit is formed of a second transistor for outputting current in accordance with the input control signal which is input from the current control circuit unit to a control electrode of the second transistor, and the second transistor outputs the proportional current proportional to the current output from the first transistor.

8. The voltage comparison circuit as claimed in claim 7, wherein the first transistor and the second transistor are MOS transistors of a same type, and the first transistor has twice a transistor size of the second transistor.

9. The voltage comparison circuit as claimed in claim 1, wherein the current control circuit unit includes a proportional current generating circuit configured to generate and output a proportional current proportional to the first constant current output from the constant current circuit unit; a second resistor through which the proportional current output from the proportional current generating circuit flows; and a control circuit configured to control a current value of the proportional current flowing through the second resistor so that a voltage difference between both ends of the second resistor becomes equal to a predetermined reference voltage.

10. The voltage comparison circuit as claimed in claim 9, wherein the proportional current generating circuit is an input transistor of a current mirror circuit, and the constant current circuit unit is an output transistor of the current mirror circuit.

11. The voltage comparison circuit as claimed in claim 1, further comprising:
   a third resistor connected between the constant current circuit unit and the second input transistor;
   a first switching unit configured to short-circuit the first resistor; and
   a second switching unit configured to short-circuit the third resistor;
   wherein the first switching unit and the second switching unit perform opposite switching operations in accordance with the signal indicating the result of the detection, the signal being binary.

12. The voltage comparison circuit as claimed in claim 1, further comprising a fourth resistor connected between the second input transistor and the second load circuit.

13. The voltage comparison circuit as claimed in claim 1, wherein when two or more differential amplifier circuit units are disposed, the current control circuit unit controls the current value of the first constant current of each of the differential amplifier circuit units so that the voltage difference between the both ends of the first resistor becomes equal to the predetermined value.

14. A semiconductor integrated circuit having a voltage comparison circuit for detecting a voltage difference of two input signals, wherein the voltage comparison circuit includes one or more differential amplifier circuit units, each of which includes a differential pair of a first input transistor and a second input transistor each input transistor having a control electrode to which a corresponding one of the input signals is input, a constant current circuit unit configured to generate a first constant current in accordance with an input control signal and supply the first constant current to the first input transistor and the second input transistor, and a first resistor connected between the constant current circuit unit and the first input transistor; and a current control circuit unit configured to perform operational control on the constant current circuit unit to control a current value of the first constant current, wherein the current control circuit unit controls the current value of the first constant current so that a voltage difference between both ends of the first resistor becomes equal to a predetermined value.

15. An electronic device having a predetermined function and including a semiconductor integrated circuit, wherein the semiconductor integrated circuit has a voltage comparison circuit for detecting a voltage difference of two input signals, wherein the voltage comparison circuit includes one or more differential amplifier circuit units, each of which includes a differential pair of a first input transistor and a second input transistor each input transistor having a control electrode to which a corresponding one of the input signals is input, a constant current circuit unit configured to generate a first constant current in accordance with an input control signal and supply the first constant current to the first input transistor and the second input transistor, and a first resistor connected between the constant current circuit unit and the first input transistor; and a current control circuit unit configured to perform operational control on the constant current circuit unit to control a current value of the first constant current, wherein the current control circuit unit controls the current value of the first constant current so that a voltage difference between both ends of the first resistor becomes equal to a predetermined value.

* * * * *